(12) United States Patent
Shimamura et al.

(10) Patent No.: US 9,121,914 B2
(45) Date of Patent: Sep. 1, 2015

(54) DEFECT DETECTION METHOD, METHOD FOR REPAIRING ORGANIC EL ELEMENT, AND ORGANIC EL DISPLAY PANEL

(71) Applicant: JOLED INC., Tokyo (JP)

(72) Inventors: Takayuki Shimamura, Hyogo (JP); Yoshiki Hayashida, Osaka (JP); Akinori Shiota, Osaka (JP); Shinya Tsuchida, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/238,227

(22) PCT Filed: Feb. 22, 2013

(86) PCT No.: PCT/JP2013/001015
§ 371 (c)(1),
(2) Date: Feb. 11, 2014

(87) PCT Pub. No.: WO2013/186961
PCT Pub. Date: Dec. 19, 2013

(65) Prior Publication Data
US 2014/0154818 A1      Jun. 5, 2014

(30) Foreign Application Priority Data

Jun. 14, 2012    (JP) ................................. 2012-134817

(51) Int. Cl.
*G01R 31/44* (2006.01)
*H01L 51/56* (2006.01)
(Continued)

(52) U.S. Cl.
CPC .............. *G01R 31/44* (2013.01); *H01L 22/14* (2013.01); *H01L 51/5203* (2013.01); *H01L 51/56* (2013.01); *G09G 3/3208* (2013.01); *H01L 2251/568* (2013.01)

(58) Field of Classification Search
CPC .................. H01L 2251/5315; H01L 27/3246; H01L 51/56; H01L 51/5284; H01L 51/5203; H01L 27/3248; H01L 29/78609; H01L 51/5012; H01L 2227/323; H01L 2251/5392; H01L 27/326; H01L 27/3279; G09G 2300/0439; G09G 2330/08
See application file for complete search history.

(56) References Cited

U.S. PATENT DOCUMENTS 5,443,922 A * 8/1995 Nishizaki et al. ............. 428/690
6,111,274 A * 8/2000 Arai ............................... 257/96
(Continued)

FOREIGN PATENT DOCUMENTS

| JP | 05-163488 | 6/1993 |
|---|---|---|
| JP | 2003-051384 | 2/2003 |

(Continued)

OTHER PUBLICATIONS

International Search Report (ISR) in International Patent Application No. PCT/JP2013/001015, dated May 28, 2013.

*Primary Examiner* — Evan Pert
*Assistant Examiner* — Gustavo Ramallo
(74) *Attorney, Agent, or Firm* — Greenblum & Bernstein, P.L.C.

(57) ABSTRACT

A defect detection method for an organic EL element having a first electrode, a second electrode, and a functional layer and a light-emission layer disposed between the electrodes, including: applying a first voltage, between the electrodes, that, when the organic EL element includes, between the electrodes, a defective portion that is a potential cause of non-light emission of the light-emission layer, reduces electrical resistance of a first portion, of the functional layer, corresponding to the defective portion and makes the organic EL element detectable as a dark spot, whose light-emission layer does not emit light; and after applying the first voltage, applying a second voltage between the electrodes and detecting whether or not the organic EL element is the dark spot, the second voltage, when the organic EL element does not include the defective portion, causing the light-emission layer to emit light.

12 Claims, 8 Drawing Sheets

(51) Int. Cl.
*H01L 21/66* (2006.01)
*H01L 51/52* (2006.01)
*G09G 3/32* (2006.01)

(56) References Cited

U.S. PATENT DOCUMENTS

| | | | |
|---|---|---|---|
| 6,369,507 B1 * | 4/2002 | Arai | 313/506 |
| 7,190,335 B2 * | 3/2007 | Yamazaki et al. | 345/76 |
| 8,518,719 B2 * | 8/2013 | Hiraoka et al. | 438/4 |
| 8,597,067 B2 * | 12/2013 | Hiraoka | 445/3 |
| 8,687,874 B2 * | 4/2014 | Hiraoka | 382/149 |
| 8,884,996 B2 * | 11/2014 | Teranishi et al. | 345/690 |
| 2002/0181276 A1 * | 12/2002 | Yamazaki | 365/175 |
| 2005/0215163 A1 * | 9/2005 | Tamura et al. | 445/24 |
| 2006/0102910 A1 * | 5/2006 | Yamazaki et al. | 257/83 |
| 2008/0057818 A1 * | 3/2008 | Ogawa | 445/3 |
| 2009/0174304 A1 * | 7/2009 | Kanazawa et al. | 313/318.08 |
| 2011/0014730 A1 | 1/2011 | Yamazaki et al. | |
| 2011/0262679 A1 * | 10/2011 | Azuma et al. | 428/68 |
| 2011/0278603 A1 * | 11/2011 | Miyazawa et al. | 257/88 |
| 2013/0102094 A1 * | 4/2013 | Hiraoka et al. | 438/16 |
| 2014/0008627 A1 * | 1/2014 | Hiraoka et al. | 257/40 |

FOREIGN PATENT DOCUMENTS

| | | |
|---|---|---|
| JP | 2004-247088 | 9/2004 |
| JP | 2005-276600 | 10/2005 |
| JP | 2005-310659 | 11/2005 |
| JP | 2006-154793 | 6/2006 |
| JP | 2008-066003 | 3/2008 |
| JP | 2008-097828 | 4/2008 |
| JP | 2010-267420 | 11/2010 |

* cited by examiner

DEFECT DETECTION METHOD, METHOD FOR REPAIRING ORGANIC EL ELEMENT, AND ORGANIC EL DISPLAY PANEL

TECHNICAL FIELD

The present invention relates to a defect detection method performed with respect to an organic electroluminescence (EL) element in an organic EL display panel.

BACKGROUND ART

Recently, organic EL display panels are gaining popularity as display devices. A typical organic EL display panel includes a substrate and organic EL elements disposed on the substrate. An organic EL display panel realizes high visibility and high shock resistance, since the organic EL elements included therein have high visibility for being self-luminescent and have high shock resistance for having a fully solid-state structure.

An organic EL element is a current-driven light-emission element, and typically includes an electrode pair composed of an anode and a cathode, and a plurality of organic EL functional layers that are layered between the anode and the cathode. The organic EL functional layers include a light-emission layer that emits light by utilizing electroluminescence occurring when carriers (holes and electrons) recombine therein.

In the process of manufacturing an organic EL display panel, there are cases where an organic EL functional layer, an electrode, etc., in an organic EL element, is formed to have a locally uneven surface. Such a locally uneven surface may be formed, for example, as a result of a foreign particle of extremely small size, such as dust, adhering to the surface of the organic EL functional layer, the electrode, etc., or as a result of the presence of a defect in the resist used for forming the organic EL functional layer, the electrode, etc. Such a locally uneven surface of the organic EL functional layer, the electrode, etc., may result in an organic EL functional layer formed above the locally uneven surface having an area with uneven film thickness. Further, such a locally uneven surface may even result in a local absence in the organic EL functional layer formed thereabove. The forming of such an area having uneven film thickness and/or such a local absence in the organic EL functional layer may result in short-circuiting between the anode and the cathode, which is a cause of non-light emission of the light-emission layer. In the technical field to which the present invention belongs, an organic EL element whose light-emission layer does not emit light even when the organic EL display panel is driven is commonly referred to as a dark spot, a dead pixel, etc. As such, in the present disclosure, an organic EL element whose light-emission layer does not emit light (i.e., a non light-emitting pixel in an organic EL display panel) is referred to as a dark spot.

Here, it should be noted that dark spots also include, in addition to organic EL elements whose light-emission layers do not emit light permanently from the beginning, organic EL elements in which the short-circuiting only occurs from time to time (non-permanently) and organic EL elements that emit light normally in the beginning but do not emit light after a certain period of time elapses. In particular, when dark spots occur in an organic EL display panel after the organic EL display panel is shipped as a product, the user of such an organic EL display panels suffer from inconvenience. As such, various measures are being taken to detect and repair such potential dark spots in organic EL display panels before shipment.

For example, Patent Literature 1 discloses one method of making a potential dark spot detectable. According to the method disclosed by Patent Literature 1, migration of aluminum included in a cathode takes place when a predetermined reverse bias voltage is applied to an organic EL element that has a defective portion. This results in breakdown occurring in the defective portion and the organic EL element being put in a permanent short-circuit state. Thus, the organic EL element having the defective portion, which is a potential dark spot, is made detectable as a dark spot.

Patent Literature 2 discloses one method of repairing a dark spot. According to the method disclosed by Patent Literature 2, when a reverse bias voltage is applied to an organic EL element that has a defective portion, current flows in a concentrated manner through the defective portion. This results in the temperature of the defective portion rising, which brings about some form of change in the defective portion that increases the electrical resistance of the defective portion to a point where the defective portion no longer conducts current. As examples of such changes that the defective portion undergoes due to the application of the reverse bias voltage and the resultant rise of temperature, Patent Literature 2 discloses the defective portion burning out, the defective portion transitioning into the gas phase, and the defective portion transforming into an electrically-insulative body through oxidization/carbonization.

CITATION LIST

Patent Literature

[Patent Literature 1]
  Japanese Patent Application Publication No. 2008-066003
[Patent Literature 2]
  Japanese Patent Application Publication No. 2003-051384

SUMMARY OF INVENTION

Technical Problem

However, when attempting to make potential dark spots detectable according to the method disclosed in Patent Literature 1, there is a risk of some potential dark spots not actually being made detectable as dark spots. Specifically, the migration of aluminum as described in Patent Literature 1 does not readily take place within a short period of time, and it is uncertain as to whether or not such migration actually takes place. As such, there is a risk of the migration not occurring to an extent sufficient to bring about the breakdown in the defective portion in some of the potential dark spots, which results in some of the potential dark spots not being made detectable as dark spots.

Further, when attempting to repair dark spots according to the method disclosed in Patent Literature 2, there is a risk of some dark spots not being repaired and thus remaining as dark spots. Specifically, according to the method disclosed in Patent Literature 2, the electrical conductivity of the defective portion decreases as the electrical resistance of the defective portion increases. Due to this, the change in the defective portion may stop before the defective portion becomes completely electrically insulative. As such, there is a risk of the effect of the repair being insufficient, which results in dark spots remaining even after the repair is performed.

The present invention has been made in view of the problems described above, and provides a defect detection method that makes potential dark spots detectable as dark spots with a high degree of certainty and thus enables the repairing of the dark spots to be performed with a high degree of certainty.

Solution to the Problems

One aspect of the present invention is a defect detection method performed with respect to an organic EL element including a first electrode, a second electrode, a functional layer, and a light-emission layer, the functional layer and the light-emission layer disposed between the first electrode and the second electrode. The defect detection method includes: applying a first voltage between the first electrode and the second electrode, the first voltage, when the organic EL element includes a defective portion, between the first electrode and the second electrode, that is a potential cause of non-light emission of the light-emission layer, reducing an electrical resistance of a first portion of the functional layer, the first portion being a portion of the functional layer corresponding to the defective portion; and applying, after the application of the first voltage, a second voltage between the first electrode and the second electrode and thus detecting whether or not the organic EL element is a dark spot, the second voltage, when the organic EL element does not include the defective portion, causing the light-emission layer to emit light, the dark spot being an organic EL element whose light-emission layer does not emit light.

Advantageous Effects of the Invention

According to the defect detection method pertaining to one aspect of the present invention, the first voltage is applied between the first electrode and the second electrode such that, when the organic EL element includes the defective portion between the first electrode and the second electrode, the electrical resistance of the first portion of the functional layer is reduced. Due to this, the organic EL element, when including the defective portion, is put in a short-circuit state where current flows in a concentrated manner through the defective portion, and thus the organic EL element is made detectable as a dark spot. Accordingly, in the subsequent application of the second voltage for actually detecting a dark spot, the organic EL element (a subpixel in an organic EL display panel), when including the defective portion, does not emit light, and thus, the organic EL element is detected as a dark spot with a high degree of certainty.

DESCRIPTION OF EMBODIMENTS

<<Overview of Aspects of Present Invention>>

Figure 1:
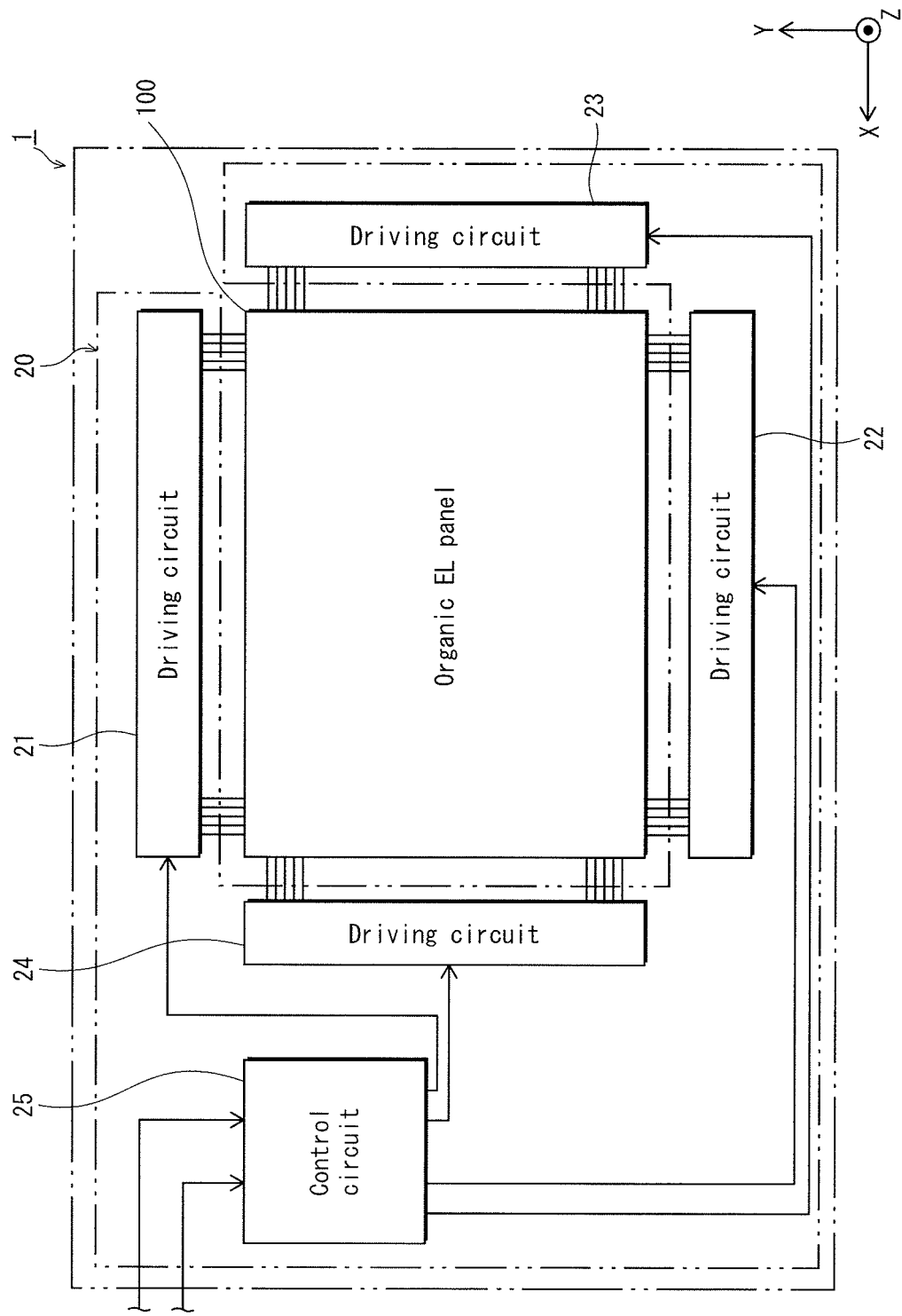
FIG. 1 is a schematic block diagram illustrating a structure of a display device pertaining to embodiment 1 of the present invention.

One aspect of the present invention is a defect detection method performed with respect to an organic EL element including a first electrode, a second electrode, a functional layer, and a light-emission layer, the functional layer and the light-emission layer disposed between the first electrode and the second electrode. The defect detection method includes: applying a first voltage between the first electrode and the second electrode, the first voltage, when the organic EL element includes a defective portion, between the first electrode and the second electrode, that is a potential cause of non-light emission of the light-emission layer, reducing an electrical resistance of a first portion of the functional layer, the first portion being a portion of the functional layer corresponding to the defective portion; and applying, after the application of the first voltage, a second voltage between the first electrode and the second electrode and thus detecting whether or not the organic EL element is a dark spot, the second voltage, when the organic EL element does not include the defective portion, causing the light-emission layer to emit light, the dark spot being an organic EL element whose light-emission layer does not emit light.

According to the defect detection method pertaining to one aspect of the present invention, by the application of the first voltage, the electrical resistance of the first portion of the functional layer, which corresponds to the defective portion, is reduced. Accordingly, in the subsequent application of the second voltage for actually detecting a dark spot, the organic EL element, when including the defective portion, is put in a short-circuit state where current flows in a concentrated manner through the first portion, whose electrical resistance has been reduced through the application of the first voltage. Thus, the organic EL element, when including the defective portion, is detected as a dark spot with a high degree of certainty.

In the defect detection method pertaining to one aspect of the present invention, the functional layer may be made of an organic material doped with a metal, and in the applying of the first voltage, when the organic EL element includes the defective portion, the first voltage may reduce the electrical resistance of the first portion by causing the first portion to conduct current and thus heat up, whereby in the first portion, a gap is formed due to transition of the organic material to a gas phase and the metal, which is released from the organic material due to the transition of the organic material to the gas phase, is deposited onto a side wall portion of the functional layer surrounding the gap.

In the defect detection method pertaining to one aspect of the present invention, the first electrode may be an anode and the second electrode may be a cathode, and in the applying of the first voltage, a higher voltage may be applied to the second electrode than to the first electrode.

In the defect detection method pertaining to one aspect of the present invention, in the applying of the first voltage, the first current may be applied until the electrical resistance of the first portion is reduced to lower than an electrical resistance of a second portion of the functional layer when the organic EL element includes the defective portion, the second portion being a portion of the functional layer not corresponding to the defective portion.

In the defect detection method pertaining to one aspect of the present invention, the defective portion may be located below the functional layer and comprises at least one of a protrusion, a recess, and a foreign particle having higher electrical conductivity than the light-emission layer, and the first portion may be located above the defective portion and may have an area having smaller film thickness than the second portion.

In the defect detection method pertaining to one aspect of the present invention, the functional layer may be made of a material whose electrical resistance decreases in proportion with an increase in a cumulative amount of current flowing through the functional layer.

In the defect detection method pertaining to one aspect of the present invention, in the applying of the first voltage, when the organic EL element includes the defective portion, the electrical resistance of the first portion may be reduced to lower than the electrical resistance of the second portion by the first voltage causing the first portion to conduct a greater current than the second portion and thereby altering the first portion.

In the defect detection method pertaining to one aspect of the present invention, in the applying of the first voltage, when the organic EL element includes the defective portion, the first voltage may cause the first portion to conduct a greater current than the second portion and thereby induces a stronger electric field in the first portion than in the second portion, whereby in at least a part of the first portion, a gap is formed due to destruction or alteration of shape of the first portion.

Another aspect of the present invention is a repair method performed with respect to an organic EL element, including: processing an organic EL element having been detected, according to the above-described defect detection method, as the dark spot such that electrical resistance is increased of at least one of a portion of the first electrode corresponding to the first portion and a portion of the second electrode corresponding to the first portion.

Yet another aspect of the present invention is an organic EL display panel including a substrate and a plurality of organic EL elements formed above the substrate. In the organic EL display panel, each of the organic EL elements includes: a light-emission layer; a functional layer disposed above the light-emission layer and made of an organic material doped with a metal; and a pair of electrodes between which the light-emission layer and the functional layer are disposed. In the organic EL display panel, at least one of the organic EL elements has, below the functional layer, at least one of a protrusion, a recess, and a foreign particle having higher electrical conductivity than the light-emission layer, and in the at least one of the organic EL elements, the functional layer has a first portion located above the at least one of the protrusion, the recess, and the foreign particle, and a gap in at least a part of the first portion, the gap having the metal, with which the organic material is doped, deposited onto a perimeter thereof.

<Embodiment 1>
[1.1 Overall Structure]

FIG. 1 is a schematic block diagram illustrating a structure of an organic EL display device 1 pertaining to embodiment 1. The organic EL display device 1 includes an organic EL display panel 100 pertaining to embodiment 1. As illustrated in FIG. 1, the organic EL display device 1 includes the organic EL display panel 100 and a drive control unit 20 connected to the organic EL display panel 100. The organic EL display panel 100 is a panel utilizing electroluminescence occurring in organic material, and includes a plurality of organic EL elements arranged, for example, to form a matrix. The drive control unit 20 includes four driving circuits, namely driving circuits 21 through 24, and a control circuit 25.

Note that when the organic EL display device 1 is actually implemented, the arrangement of the drive control unit 20 with respect to the organic EL display panel 100 is not limited to the arrangement illustrated in FIG. 1.

[1.2 Structure of Organic EL Display Panel]

In the following, description is provided on a structure of the organic EL display panel 100, with reference to FIG. 2.

Figure 2:
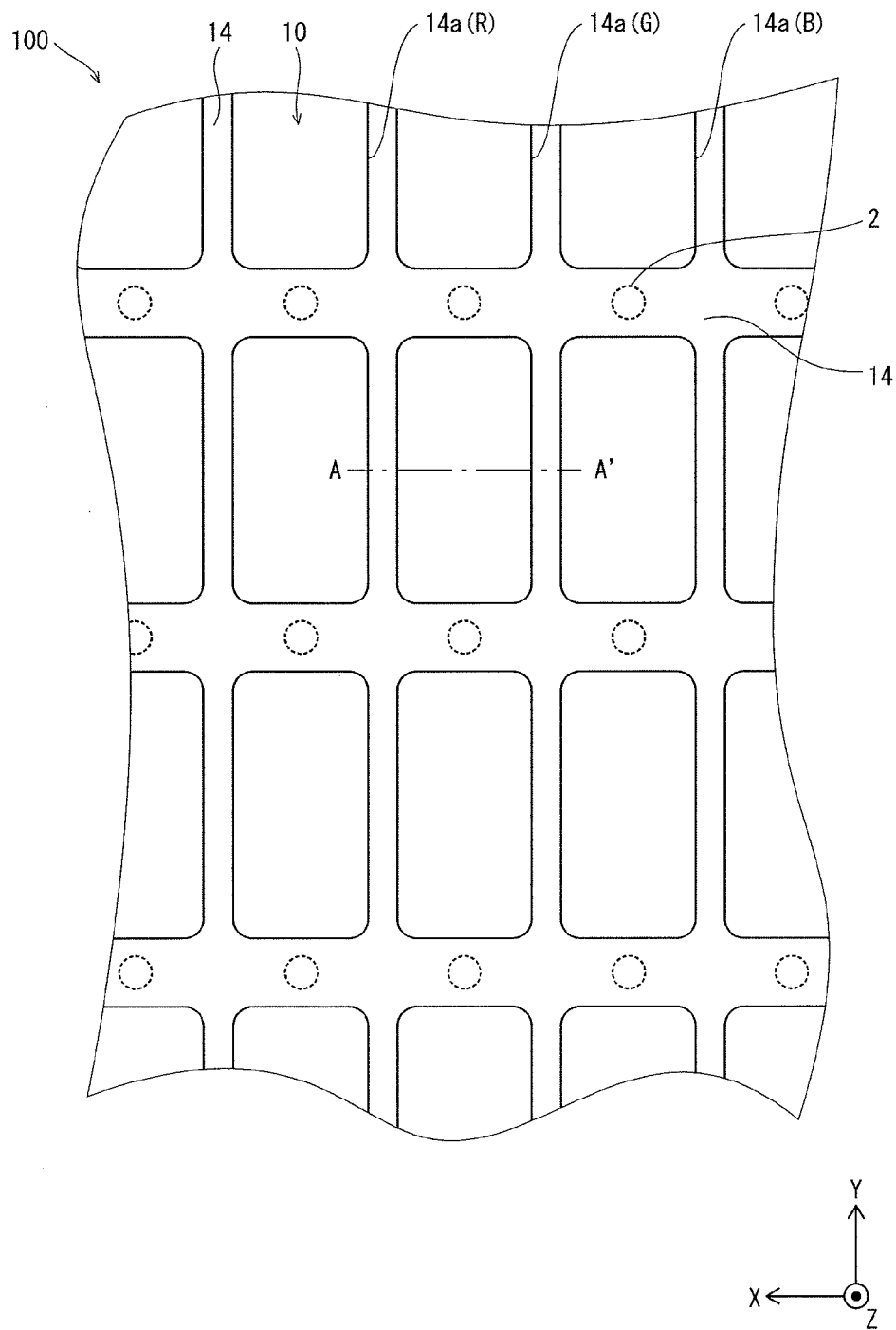
FIG. 2 is a schematic plan view of pixels of an organic EL display panel pertaining to embodiment 1.
Figure 3:
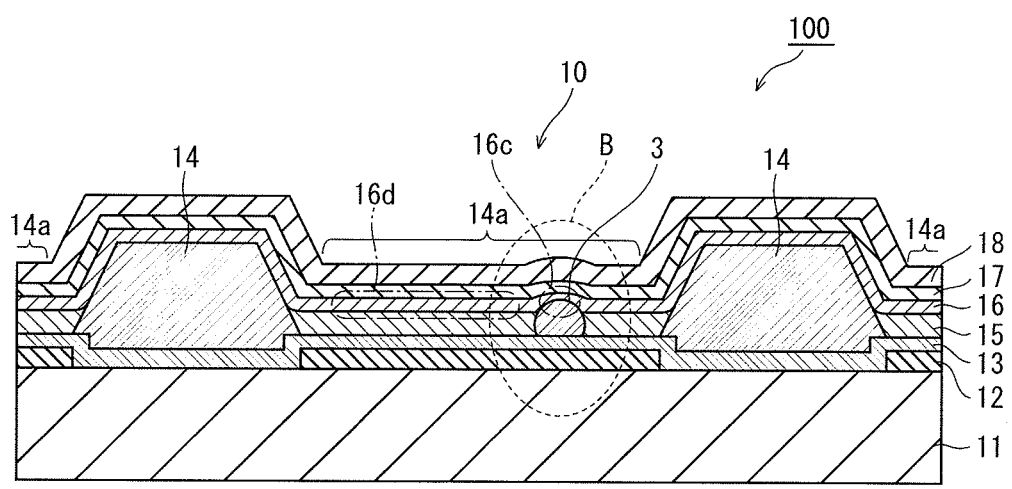
FIG. 3 is a cross-sectional view, taken along line A-A' in FIG. 2, schematically illustrating an overall structure of an organic EL element pertaining to embodiment 1.
Figure 3:
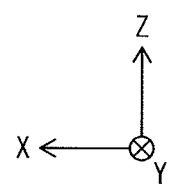

FIG. 2 is a plan view schematically illustrating an overall structure of the organic EL display panel 100 when seen from a display surface side. FIG. 3 is a partially enlarged cross-sectional view of the organic EL display panel 100 taken along the line A-A' in FIG. 2. Note that the display surface of the organic EL display panel 100 is located in the Z direction in FIG. 3, and thus, the organic EL display panel 100 is a so-called top-emission type display panel.

As illustrated in FIG. 3, an organic EL element 10, which is a subpixel of the organic EL display panel 100, includes as the main components thereof a substrate 11; an anode 12 (corresponding to the first electrode in the present embodiment); a hole injection layer 13; a bank 14; an organic light-emission layer 15; an electron transport layer 16 (corresponding to the functional layer in the present embodiment); a cathode 17 (corresponding to the second electrode in the present embodiment); and a sealing layer 18. Specifically, each subpixel in the organic EL display panel 100 includes an organic light-emission layer 15 of a corresponding one of the colors red (R), green (G), and blue (B). Further, a plurality of such subpixels are disposed so as to form a matrix, as illustrated in FIG. 2. Note that the electron transport layer 16, the cathode 17, and the sealing layer 18 are not illustrated in FIG. 2 to simplify the illustration.

In addition, the organic EL element 10 illustrated in FIG. 2 includes a defective portion 3. The defective portion 3 is located above the hole injection layer 13.

<Substrate>

The substrate 11 is the basis of the organic EL display panel 100. For example, the substrate 11 is made of electrically-insulative material such as alkali-free glass, soda glass, non-fluorescent glass, phosphate glass, borate glass, quartz, acrylic resin, styrenic resin, polycarbonate resin, epoxy resin, polyethylene, polyester, silicone resin, and alumina.

In addition, although not illustrated in FIG. 3, a thin film transistor (TFT) layer that is for driving the organic EL element 10 is formed on a surface of the substrate 11. Further, an interlayer insulation layer is formed above the TFT layer, and the anode 12 is disposed above the TFT layer with the interlayer insulation layer in between. The interlayer insulation layer is made, for example, of organic electrically-insulative material such as acrylic resin, polyimide resin, and novolac-type phenolic resin or inorganic electrically-insulative material such as silicon oxide (SiO) and silicon nitride (SiN). The interlayer insulation layer ensures electric insulation between the TFT layer and the anode 12, and further, planarizes unevenness in height of an upper surface of the TFT layer above which the interlayer insulation layer is formed.

Here, note that in the present embodiment, n-channel TFTs are formed in the TFT layer. Further, in the organic EL display panel 100, the anodes 12 are disposed at a side of the substrate 11, whereas the cathode 17 is disposed at a side of the display surface.

<Anode>

The anode 12 is a pixel electrode that is provided with respect to each subpixel of the organic EL display panel 100. The anode 12 is made, for example, of light reflective electrically-conductive material, such as silver (Ag), aluminum (Al), aluminum alloy, molybdenum (Mo), APC (alloy of silver, palladium, and copper), ARA (alloy of silver, rubidium, and gold), MoCr (alloy of molybdenum and chromium), MoW (alloy of molybdenum and tungsten), NiCr (alloy of nickel and chromium), and ACL (alloy of aluminum, cobalt, germanium, and lanthanum).

Note that a conventional transparent electrically-conductive film may be additionally disposed on a top surface of the anode 12. The transparent electrically-conductive film may be made, for example, of indium tin oxide (ITO), indium zinc oxide (IZO), etc. Such a transparent electrically-conductive film, disposed between the anode 12 and the hole injection layer 13, improves the bonding between the anode 12 and the hole injection layer 13.

<Hole Injection Layer>

The hole injection layer 13 is made, for example, of a metal oxide such as an oxide of silver (Ag), an oxide of molybdenum (Mo), an oxide of chromium (Cr), an oxide of vanadium (V), an oxide of tungsten (W), and an oxide of nickel (Ni), or electrically-conductive polymer material such as PEDOT (a mixture of polythiophene and polystyrene sulfonate). In particular, the hole injection layer 13, when made of a metal oxide, has a function of stably injecting and transporting holes into the organic light-emission layer 15 or injecting and transporting holes into the organic light-emission layer 15 while assisting the generation of holes.

Further, the hole injection layer 13, when made of an oxide of a transition metal, has multiple energy levels due to oxides of transition metals having multiple oxidation states. This results in the hole injection layer 13 readily performing hole injection and thus allows for reduction of driving voltage of the organic EL display panel 100.

<Bank>

The bank 14 is disposed on a surface of the hole injection layer 13, as illustrated in FIG. 3. The bank 14 defines an opening 14a, in which the organic light-emission layer 15 is to be formed. The bank 14 is formed such that different portions thereof have the same trapezoidal cross-sectional shape, and is made of electrically-insulative organic material (for example, acrylic resin, polyimide resin, or novolac-type phenolic resin). When the organic light-emission layer 15 is formed by application of ink, the bank 14 functions as a structure that prevents the ink applied with respect to the opening 14a from flowing out. On the other hand, when the organic light-emission layer 15 is formed by deposition of material, the bank 14 functions as a structure that holds a mask for deposition.

Further, the opening 14a formed by the bank 14 defines a light-emission region of the organic EL element 10. Thus, each of such light-emission regions defined by the openings 14a formed across the organic EL display panel 100 corresponds to one subpixel of the organic EL display panel 100.

<Organic Light-Emission Layer>

The organic light-emission layer 15 emits light by carriers (holes and electrons) recombining therein. Further, the organic light-emission layer 15 contains organic material corresponding to one of the colors R, G, and B. The organic light-emission layer 15 is formed within the opening 14a defined by the bank 14. Due to this, one organic light-emission layer 15 is formed for each subpixel of the organic EL display panel 100.

Examples of material usable for forming the organic light-emission layer 15 include poly(para-phenylenevinylene) (PPV) and polyfluorene. Other examples of material usable for forming the organic light-emission layer 15 include: a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

<Electron Transport Layer>

The electron transport layer 16 has the function of transporting, to the organic light-emission layer 15, electrons injected thereto from the cathode 17. The electron transport layer 16 is made of an organic material 16a (refer to FIGS. 4A through 4C for illustration) doped with a metal 16b (refer to FIGS. 4A through 4C for illustration). Examples of the organic material 16a include an oxadiazole derivative (OXD), a triazole derivative (TAZ), and a phenanthroline derivative (e.g., BCP, Bphen). Examples of the metal 16b with which the organic material 16a is doped include an alkaline metal such as lithium (Li) and an alkaline earth metal such as barium (Ba). As for the method for doping the organic material 16a with the metal 16b, co-deposition is commonly known. However, the doping may be performed by sputtering, or by dispersing minute particles of the metal 16b in the organic material 16a. In the present embodiment, an oxadiazole derivative is used as the organic material 16b, and barium is used as the metal 16b. In other words, the electron transport layer 16 is made of an oxadiazole derivative doped with barium.

<Cathode>

One cathode 17 is provided to extend across the plurality of the subpixels of the organic EL display panel 100. The cathode 17 is made, for example, of electrically-conductive light-transmissive material such as ITO and IZO. In a top-emission type organic EL display panel, it is preferable to form the cathode 17 by using light-transmissive material.

Examples of materials other than those described above that may be used to form the cathode 17 include alkaline metals and alkaline earth metals. Alternatively, the cathode 17 may have a multilayer structure including a layer containing a halide of an alkaline metal or an alkaline earth metal and a layer containing silver layered in the stated order. When the cathode 17 has the multilayer structure as described above, the layer containing silver may be made of only silver or may be made of an alloy of silver. In addition, when the cathode 17 has the multilayer structure as described above, a refractive index adjustment layer having high transparency may be disposed above the layer containing silver.

<Sealing Layer 18>

The sealing layer 18 is a layer for protecting the hole injection layer 13, the organic light-emission layer 15, the electron transport layer 16, and the cathode 17 from moisture and/or oxygen entering the organic EL display panel 100.

Note that although not illustrated in FIG. 3, black matrixes, color filters, etc., may be disposed above the sealing layer 18.

<Defective Portion>

The defective portion 3 exists between the anode 12 and the cathode 17 and is either a foreign particle or a protrusion portion of a certain layer. Due to the presence of the defective portion 3, in each of the layers of the organic EL element 10 formed above the defective portion 3, a portion corresponding in position to the defective portion 3 (a portion located above the defective portion 3) is formed protruding upwards (towards the Z direction in FIG. 3). Further, in each of the layers of the organic EL element 10 formed above the defective portion 3, a part of the portion corresponding to the defective portion may be missing. Here, note that in the present embodiment, the defective potion 3 is a foreign particle, or more specifically, a foreign particle having an extremely small size such as dust.

As illustrated in FIGS. 2 and 3, in the organic EL display panel 100 pertaining to the present embodiment, the defective portion 3 is located above the hole injection layer 13. With regards to the layers formed above the defective portion 3, a portion of the organic light-emission layer 15 located above the defective portion 3 is either missing (i.e., a pinhole is formed in the organic light-emission layer 15) or extremely thin compared to a portion of the organic light-emission layer 15 that is not located above the defective portion 3. Further, a portion of the electron transport layer 16, which is located above the defective portion 3 and the organic light-emission layer 15, that is located above the defective portion 3 and thus corresponding to the defective portion 3 (hereinafter referred to as a "first portion 16c") is thinner than a portion of the electron transport layer 16 that is not located above the defective portion 3 and thus not corresponding to the defective portion 3 (hereinafter referred to as a "second portion 16d").

Here, note that in the present embodiment, the defective portion 3 is made of an organic substance, and thus has higher electrical conductivity than the organic light-emission layer 15.

Further, note that although FIG. 3 provides illustration of a case where the organic EL element 10 has the defective portion 3, not all of the organic EL elements 10 included in the organic EL display panel 100 have the defective portion 3. That is, in actuality, only few of the organic EL elements 10 included in the organic EL display panel 100 have the defective portion 3, and there may also be cases where none of the organic EL elements 10 included in the organic EL display panel 100 have the defective portion 3. In addition, in the organic EL display panel 100, when the ratio of organic EL elements 10 having the defective portion 3 to the total number of organic EL elements 10 equals or exceeds a predetermined ratio, the organic EL display panel 100 is disposed of for being defective.

[1.3 Defect Detection Method and Repair Method]

In the following, description is provided on a defect detection method pertaining to one aspect of the present invention. Specifically, description is provided in the following of a defect detection method performed with respect to the organic EL display panel 100.

Figure 4A:
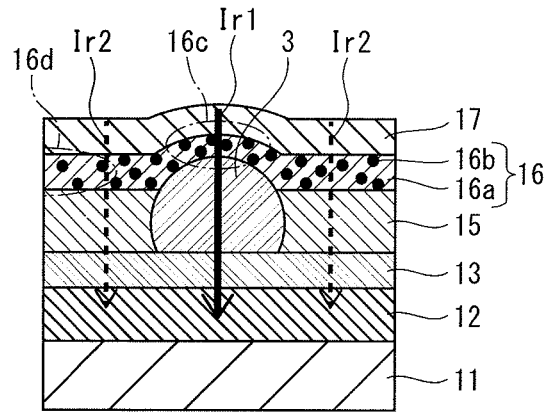
FIGS. 4A, 4B, and 4C are partially enlarged cross-sectional views each schematically illustrating the overall structure of the organic EL element pertaining to embodiment 1, FIG. 4A being a schematic cross-sectional view illustrating a state where a reverse bias voltage is applied to the organic EL element, FIG. 4B being a schematic cross-sectional view illustrating a state where a gap is formed in an electron transport layer, and FIG. 4C being a schematic cross-sectional view illustrating a state where a forward bias voltage is applied to the organic EL element.
Figure 4B:
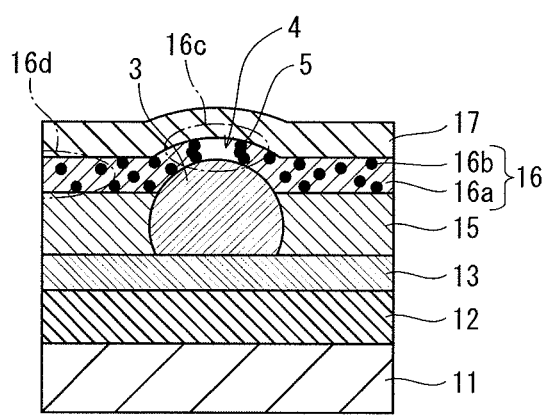
Figure 4C:
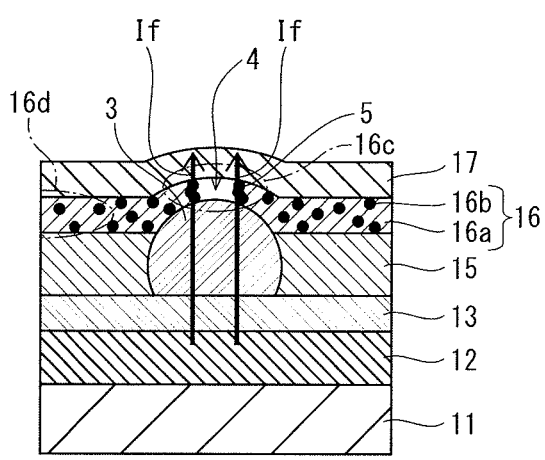

FIGS. 4A through 4C are cross-sectional views illustrating an overview of the defect detection method in the present embodiment, and each are an enlarged cross-sectional view of the part of the organic EL element 10 surrounded by the broken line B in FIG. 3.

First, a reverse bias voltage is applied between the anode 12 and the cathode 17 of the organic EL element 10. As already described above, when the organic EL element 10 has the defective portion 3, the organic light-emission layer 15 does not exist or exists having an extremely small thickness above the defective portion 3. As such, compared to when the organic EL element 10 does not have the defective portion 3, breakdown occurs in the defective portion 3 at a lower reverse bias voltage when the organic EL element 10 has the defective portion 3. When breakdown occurs, current begins to flow through the organic EL element 10. Accordingly, a reverse bias current Ir1 flows in a concentrated manner through the first portion 16c, as illustrated in FIG. 4A.

Note that in FIG. 4A, the reverse bias current Ir1, which flows through the first portion 16c, is indicated by the arrow illustrated by using a thick line, whereas a reverse bias current Ir2 that flows through the second portion 16d is indicated by the arrow illustrated by using a broken line. The difference in illustration shows that the reverse bias current Ir1 is a greater current than the reverse bias current Ir2.

When the reverse bias current Ir1 flows in a concentrated manner through the first portion 16c as described above, the first portion 16c heats up and the temperature thereof rises accordingly. As a result, the organic material 16a in the first portion 16c transitions into the gas phase, which results in a gap 4 being formed in the first portion 16c, as illustrated in FIG. 4B. Further, in the first portion 16c, the metal 16b is released from the organic material 16a due to the transition of the organic material 16a to the gas phase and is deposited on a side wall portion of the gap 4. Thus, a channel portion 5, which functions as a path of current flow between the cathode 17 and the defective portion 3, is formed. The channel portion 5 is made of the metal 16b released from the organic material 16a, and thus, has high electrical conductivity. As such, due to the forming of the channel portion 5, the electrical resistance of the first portion 16c is reduced, and the organic EL element 10 is put in a permanent short-circuit state. In this way, when the organic EL element 10 has the defective portion 3, the organic El element 10 is made detectable as a dark spot.

Here, note that the application of the reverse bias voltage is continued until the gap 4 is formed. Specifically, a voltage between 10 V and 30 V is applied for a period of 10 minutes, for example.

Further, the transition of the organic material 16a to the gas phase need not occur across the entire first portion 16c. That is, the metal 16b needs to be released from the organic material 16b by an amount that is sufficient to form the channel portion 5 to have a length (in a thickness direction of the electron transport layer 16) sufficient to electrically connect the defective portion 3 and the cathode 17. As such, it suffices for the transition of the organic material 16a to occur such that the amount of the organic material 16a transitioning to the gas phase is sufficient for releasing the amount of the metal 16b required to form the channel portion 5 having the above-described length. As such, the transition of the organic material 16a to the gas phase may occur only at a part of the first portion 16c, which results in the gap 4 formed in only a part of the first portion 16c, provided that the amount of the organic material 16a transitioning to the gas phase is sufficient in the manner described above.

Subsequent to the forming of the gap 4 and the channel portion 5 as described above, a forward bias voltage is applied between the anode 12 and the cathode 17 of the organic EL element 10 as in a typical dark spot detection process. When the organic EL element 10 has the defective portion 3, upon application of the forward bias voltage, a forward bias current If flows in a concentrated manner through the first portion 16c via the channel portion 5, while rarely flowing through the organic light-emission layer 15, as illustrated in FIG. 4C. Due to this, the organic EL element 10 having the defective portion 3 does not light, and is detected as a dark spot in the dark spot detection process.

Following this, repair processing is performed with respect to the organic EL element 10 when the organic EL element 10 is detected as a dark spot in the dark spot detection process. Specifically, in the repair processing, at least one of a portion of the anode 12 corresponding to the defective portion 3 and a portion of the cathode 17 corresponding to the defective portion 3 is provided with increased electrical resistance or is altered so as to be electrically insulative. In specific, the repair processing is performed by burning out or altering the above-described portions of the electrodes according to a conventional method, by irradiating such portions of the anode 12 and the cathode 17 with laser light.

Note that the dark spot detection process described above is performed according to a conventional method, by using a CCD camera or the like. For further details of the conventional method of the dark spot detection process, refer to the "Inspection of Emission State" section of Patent Literature 1.

Further, the method for repairing the organic EL element 10 when the organic EL element 10 is detected as a dark spot is not limited to the above-described method of using laser light. Any method may be used as long as the electrical resistance of the organic EL element 10 is increased or the organic EL element 10 is altered so as to be electrically insulative. For example, an ultrasonic wave or the like may be used instead of laser light.

[1.4 Summary of Embodiment 1]

As description has been provided up to this point, the organic EL display panel 100 pertaining to the present embodiment includes the electron transport layer 16 as the functional layer. The electron transport layer 16 is made of the organic material 16a doped with the metal 16b. Further, according to the defect detection method pertaining to the present embodiment, the application of the reverse bias voltage between the anode 12 and the cathode 17 of the organic EL element 10 is performed before the dark spot detection process is performed. Due to this, when the organic EL element 10 has the defective portion 3, the electrical resistance of the first portion 16c, which is a portion of the electron transport layer 16 corresponding in position to the defective portion 3, is reduced. Here, the electrical resistance of the first portion 16c is reduced according to the following mechanism. When the reverse bias voltage is applied with respect to the organic EL element 10, current flows in a concentrated manner through the first portion 16c, which results in an increase of the temperature of the first portion 16c. When the temperature of the first portion 16c increases, the organic material 16a in the first portion 16c transitions into the gas phase in the course of time, and the gap 4 is formed in the first portion 16c. At the same time, the metal 16b with which the organic material 16a is doped is released from the organic material 16a due to the transition of the organic material 16a to the gas phase, and is deposited onto the side wall portion of the gap 4. As such, the channel portion 5 having high electrical conductivity is formed. The electrical resistance of the first portion 16c is reduced in such a manner. Accordingly, the first portion 16c is put in a permanent short-circuit state, and thus the organic EL element 10, when including the defective portion 3 and thus is a potential dark spot, is made detectable as a dark spot. Further, in the subsequent dark spot detection process, the organic EL element 10, when including the defective portion 3, is detected as a dark spot with a high degree of certainty.

As such, according to the defect detection method pertaining to the present embodiment, the organic EL element 10, when including the defective portion 3 and thus is a potential dark spot, is forcedly transformed into a dark spot. As such, the organic EL element 10, when including the defective portion 3, is detected as a dark spot in the dark spot detection process with a high degree of certainty, and thus can be repaired prior to the shipment of the organic EL display panel 100 as a product. As such, the occurrence of dark spots in the organic EL display panel 100 while being used by a user, which results in reduction of quality of the organic EL display panel 100, is prevented.

<<Embodiment 2>>

In embodiment 1, description is provided on the organic EL display panel 100, which has n-channel TFTs. In embodiment 2, description is provided on an organic EL display panel having p-channel TFTs.

Note that in the following, in order to avoid the repetition of description already provided in embodiment 1, constituent elements that are similar to those having been described in embodiment 1 are provided with the same reference signs and description thereon is omitted. Note that this also applies to embodiment 3 and the description of the modifications of the present invention.

[2.1 Structure of Organic EL Display Panel]

Figure 5:
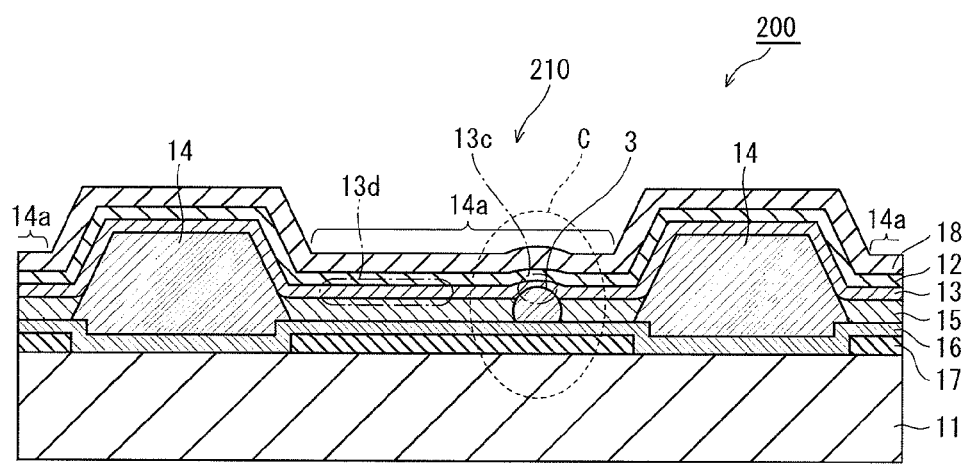
FIG. 5 is a cross-sectional view schematically illustrating an overall structure of an organic EL element pertaining to embodiment 2.

FIG. 5 is a partial cross-sectional view illustrating an overall structure of an organic EL display panel 200 pertaining to embodiment 2. Note that FIG. 5 is a cross-sectional view of the organic EL display panel 200 at a position thereof corresponding to the line A-A' in FIG. 2.

As illustrated in FIG. 5, the organic EL display panel 200 includes an organic EL element 210. The organic EL element 210 includes the substrate 11, and the cathode 17, the electron transport layer 16, and the bank 14 layered above the substrate 11 in the stated order. Further, in the organic EL element 210, the organic light-emission layer 15 is disposed within the opening 14a defined by the bank 14. In addition, above the bank 14 and the organic light-emission layer 15, the hole injection layer 13 (corresponding to the functional layer in the present embodiment), the anode 12, and the sealing layer 18 are layered in the stated order. Note that in the present embodiment, the cathode 17 is the pixel electrode.

Further, in the present embodiment, the hole injection layer 13 is made of an organic material 13a doped with a metal 13b. For example, the organic material 13a is an electrically-conductive polymer material such as α-NPD (N,N'-Bis(1-naphthylenyl)-N,N'-diphenyl-1,1'-biphenyl-4,4'-diamine), and the metal 13b is an alkaline metal such as lithium or an alkaline earth metal such as balium. In embodiment 2, the hole injection layer 13 is made of α-NPD doped with balium.

That is, in embodiment 2, the organic material 13a (refer to FIGS. 6A through 6C for illustration) is α-NPD, and the metal 16b (refer to FIGS. 6A through 6C for illustration) is balium.

In addition, note that in embodiment 2, the defective potion 3 is a foreign particle, or more specifically, a foreign particle having an extremely small size such as dust, as in embodiment 1.

Further, note that although FIG. 5 provides illustration of a case where the organic EL element 210 has the defective portion 3, not all of the organic EL elements 210 included in the organic EL display panel 200 have the defective portion 3. That is, in actuality, only few of the organic EL elements 210 included in the organic EL display panel 200 have the defective portion 3, and there may also be cases where none of the organic EL elements 210 included in the organic EL display panel 200 have the defective portion 3.

[2.2 Defect Detection Method and Repair Method]

Subsequently, description is provided in the following of a defect detection method performed with respect to the organic EL display panel 200 pertaining to embodiment 2.

Figure 6A:
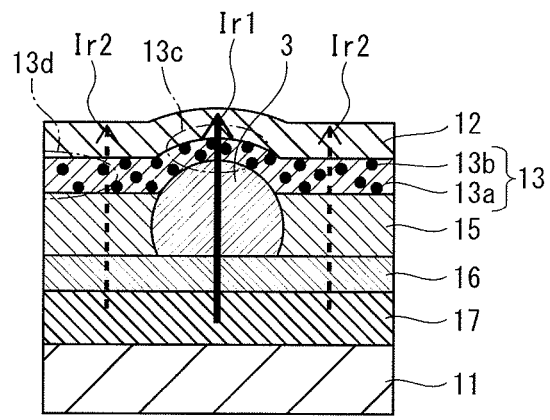
FIGS. 6A, 6B, and 6C are partially enlarged cross-sectional views each schematically illustrating the overall structure of the organic EL element pertaining to embodiment 2, FIG. 6A being a schematic cross-sectional view illustrating a state where a reverse bias voltage is applied to the organic EL element, FIG. 6B being a schematic cross-sectional view illustrating a state where a gap is formed in an electron transport layer, and FIG. 6C being a schematic cross-sectional view illustrating a state where a forward bias voltage is applied to the organic EL element.
Figure 6B:
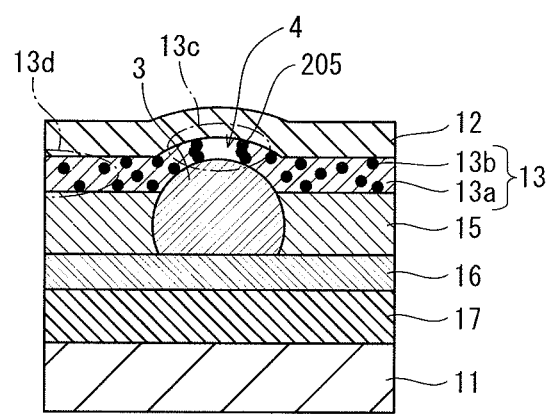
Figure 6C:
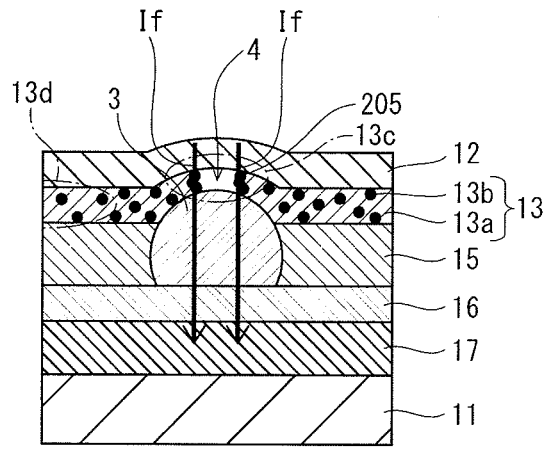

FIGS. 6A through 6C are cross-sectional views illustrating an overview of the defect detection method in the present embodiment, and each are an enlarged cross-sectional view of the part of the organic EL element 210 surrounded by the broken line C in FIG. 5.

First, a reverse bias voltage is applied between the anode 12 and the cathode 17 of the organic EL element 210. In the organic EL element 210, the defective portion 3 has higher electrical conductivity than the organic light-emission layer 15, and a first portion 13c of the hole injection layer 13 is thinner and thus has higher electrical conductivity than a second portion 13d of the hole injection layer 13. Due to this, as in the case of embodiment 1 illustrated in FIGS. 4A through 4C, compared to when the organic EL element 210 does not have the defective portion 3, breakdown occurs above the defective portion 3 at a lower reverse bias voltage when the organic EL element 210 has the defective portion 3. When breakdown of the organic EL element 210 occurs, current begins to flow through the organic EL element 210. Accordingly, a reverse bias current Ir1 flows in a concentrated manner through the first portion 13c, as illustrated in FIG. 6A. When the reverse bias current In flows in a concentrated manner through the first portion 13c, the first portion 13c heats up and the temperature thereof rises accordingly. As a result, the organic material 13a in the first portion 13c transitions into the gas phase, which results in the gap 4 being formed in the first portion 13c, as illustrated in FIG. 6B. Further, in the first portion 13c, the metal 13b is released from the organic material 13a due to the transition of the organic material 13a to the gas phase and is deposited on a side wall portion of the gap 4. Thus, a channel portion 205, which functions as a path of current flow between the anode 12 and the defective portion 3, is formed. The channel portion 205 is made of the metal 13b released from the organic material 16a, and thus, has high electrical conductivity. As such, due to the forming of the channel portion 205, the electrical resistance of the first portion 13c is reduced, and the organic EL element 210 is put in a permanent short-circuit state. In this way, when the organic EL element 210 has the defective portion 3, the organic El element 210 is made detectable as a dark spot.

Subsequent to the forming of the gap 4 and the channel portion 205 as described above, a forward bias voltage is applied between the anode 12 and the cathode 17 of the organic EL element 210, as in a typical dark point detection process. When the organic EL element 210 has the defective portion 3, upon application of the forward bias voltage, the forward bias current If flows in a concentrated manner through the first portion 13c via the channel portion 205, while rarely flowing through the organic light-emission layer 15, as illustrated in FIG. 6C. Due to this, the organic EL element 210 having the defective portion 3 does not light, and is detected as a dark spot in the dark spot detection process.

Following this, repair processing is performed with respect to the organic EL element 210 when the organic EL element 210 is detected as a dark spot in the dark spot detection process, as in embodiment 1.

Here, note that in embodiment 2, the application of the reverse bias voltage is continued until the gap 4 is formed, as in embodiment 1. Specifically, a voltage between 10 V and 30 V is applied for a period of 10 minutes, for example.

Further, in embodiment 2, the transition of the organic material 13a to the gas phase need not occur across the entire first portion 13c, as in embodiment 1. That is, the transition of the organic material 13a to the gas phase may occur only at a part of the first portion 13c, which results in the gap 4 formed in only a part of the first portion 13c, provided that the amount of the organic material 13a transitioning to the gas phase is sufficient to form the channel portion 5 to electrically connect the defective portion 3 and the anode 12.

[2.3 Summary of Embodiment 2]

As description has been provided up to this point, the organic EL display panel 200 pertaining to the embodiment 2 includes the hole injection layer 13 as the functional layer. The hole injection layer 13 is disposed above the defective portion 3 and is made of the organic material 13a doped with the metal 13b. Thus, the functional layer in embodiment 2 is similar to the functional layer in embodiment 1. Due to this, when the organic EL element 210 has the defective portion 3, the electrical resistance of the first portion 13c is reduced when the reverse bias voltage is applied to the organic EL element 210. Accordingly, the organic EL element 210, when including the defective portion 3 and thus is a potential dark spot, is made detectable as a dark spot. Further, in the subsequent dark spot detection process, the organic EL element 210, when including the defective portion 3, is detected as a dark spot with a high degree of certainty. This is similar to the case described in embodiment 1.

As such, according to the defect detection method pertaining to embodiment 2, the organic EL element 210, when including the defective portion 3 and thus is a potentially dark spot, is forcedly transformed into a dark spot. As such, the organic EL element 210, when including the defective portion 3, is detected as a dark spot in the dark spot detection process with a high degree of certainty, and thus can be repaired prior to the shipment of the organic EL display panel 200 as a product. As such, the occurrence of dark spots in the organic EL display panel 200 while being used by a user, which results in reduction of quality of the organic EL display panel 200, is prevented. This is similar to the case described in embodiment 1.

<<Embodiment 3>>

In embodiments 1 and 2, description is provided on cases where the defective portion is a foreign particle such as dust. However, it should be noted that the defective portion, which makes an organic EL element a potential dark spot, is not limited to being a foreign particle. That is, the defective portion may be a portion of a surface of a pixel electrode protruding by a relatively great amount compared to other portions of the surface. Specifically, in the forming of a pixel electrode in an organic EL element, there are cases where the pixel electrode is formed to have an uneven surface due to failure in deposition thereof. In embodiment 3, description is provided on a case where the defective portion 3 is a protrusion portion, i.e., a portion of such an uneven surface protruding by a relatively great amount.

[3.1 Structure of Organic EL Display Panel]

Figure 7:
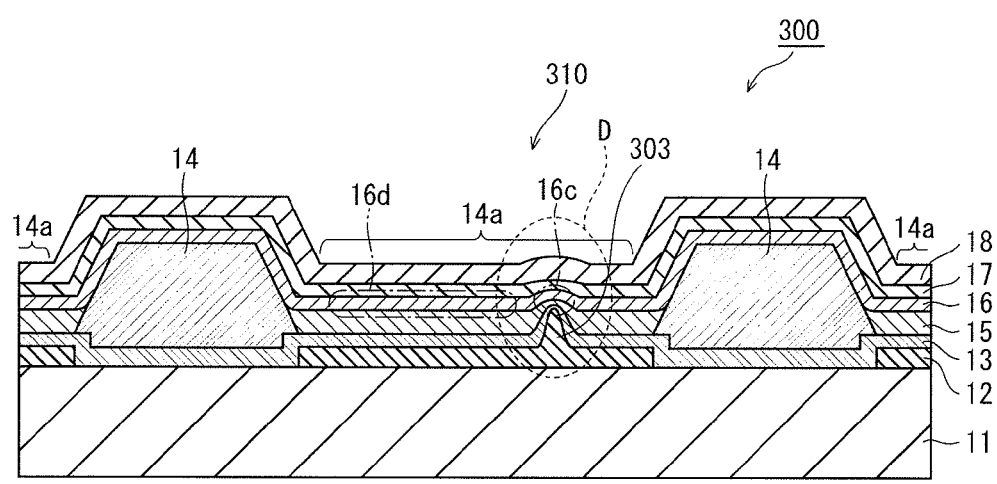
FIG. 7 is a cross-sectional view schematically illustrating an overall structure of an organic EL element pertaining to embodiment 3.

FIG. 7 is a partial cross-sectional view illustrating an overall structure of an organic EL display panel 300 pertaining to embodiment 3. Note that FIG. 7 is a cross-sectional view of the organic EL display panel 300 at a position thereof corresponding to the line A-A' in FIG. 2.

As illustrated in FIG. 7, the organic EL display panel 300 includes an organic El element 310. The organic El element 310 includes, as the main components thereof: the substrate 11; the anode 12; the hole injection layer 13; the bank 14; the organic light-emission layer 15; the electron transport layer 16 (corresponding to the functional layer in the present embodiment); the cathode 17; and the sealing layer 18. Here, note that the basic structure of the organic EL display panel 300 is similar to that of the organic EL display panel 100 pertaining to embodiment 1, other than the differences described in the following. Specifically, the organic EL display panel 300 differs from the organic EL display panel 100 in that: (i) the organic EL display panel 300 has a defective portion 303, which is not a foreign particle but instead is a protrusion of a surface of the anode 12; (ii) a portion of the hole injection layer 13 located above the defective portion 303 (a portion corresponding to the defective portion 303) is formed protruding upwards (towards the Z direction in FIG. 7); and (iii) a portion of the organic light-emission layer 15 located above the defective portion 303 is also formed protruding upwards (towards the Z direction in FIG. 7).

With regards to each of the hole injection layer 13 and the organic light-emission layer 15, a portion thereof located above the defective portion 303 is either missing (i.e., a pinhole is formed in the hole injection layer 13/the organic light-emission layer 15) or extremely thin compared to a portion thereof that is not located above the defective portion 303.

Further, note that although FIG. 7 provides illustration of a case where the organic EL element 310 has the defective portion 303, not all of the organic EL elements 310 included in the organic EL display panel 300 have the defective portion 303. That is, in actuality, only few of the organic EL elements 310 included in the organic EL display panel 300 have the defective portion 303, and there may also be cases where none of the organic EL elements 310 included in the organic EL display panel 300 have the defective portion 303. Further, the organic EL display panel 300 may include not only the defective portion 303 (a protrusion portion as described above) but also the defective portion 3 (a foreign particle) described in embodiments 1 and 2.

In addition, note that in embodiment 3, the anode 12 is the pixel electrode. Further, the organic EL display panel 300 has n-channel TFTs, as in embodiment 1.

[3.2 Defect Detection Method and Repair Method]

Subsequently, description is provided in the following of a defect detection method performed with respect to the organic EL display panel 300 pertaining to embodiment 3.

Figure 8A:
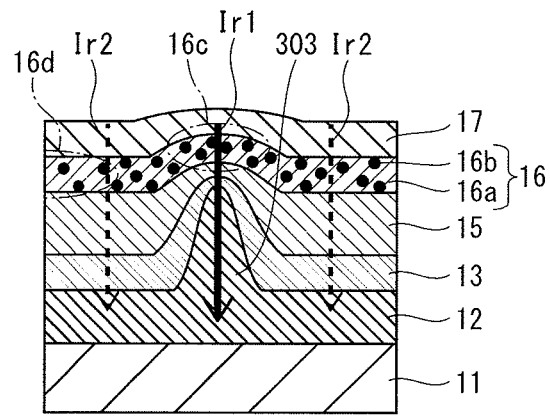
FIGS. 8A, 8B, and 8C are partially enlarged cross-sectional views each schematically illustrating the overall structure of the organic EL element pertaining to embodiment 3, FIG. 8A being a schematic cross-sectional view illustrating a state where a reverse bias voltage is applied to the organic EL element, FIG. 8B being a schematic cross-sectional view illustrating a state where a gap is formed in an electron transport layer, and FIG. 8C being a schematic cross-sectional view illustrating a state where a forward bias voltage is applied to the organic EL element.
Figure 8B:
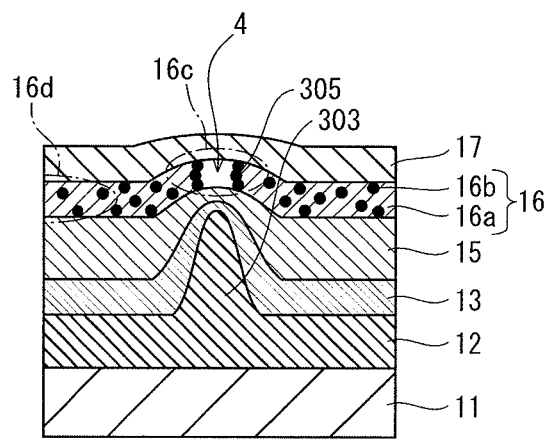
Figure 8C:
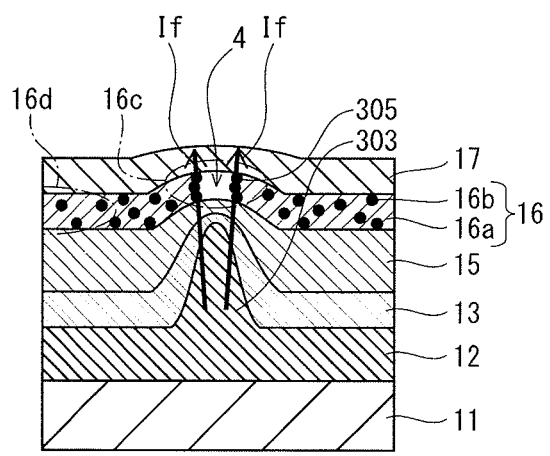

FIGS. 8A through 8C are cross-sectional views illustrating an overview of the defect detection method in the present embodiment, and each are an enlarged cross-sectional view of the part of the organic EL element 310 surrounded by the broken line D in FIG. 7.

First, a reverse bias voltage is applied between the anode 12 and the cathode 17 of the organic EL element 310. In the organic EL element 310, the defective portion 303 is a part of the anode 12, and thus has higher electrical conductivity than the hole injection layer 13. Further, in each of the hole injection layer 13, the organic light-emission layer 15, and the electron transport layer 16, a portion located above the defective portion is thinner and thus has higher electrical conductivity than a portion that is not located above the defective portion 303. Due to this, as in the case of embodiments 1 and 2, compared to when the organic EL element 310 does not have the defective portion 303, breakdown occurs above the defective portion 303 at a lower reverse bias voltage when the organic EL element 310 has the defective portion 303. When breakdown of the organic EL element 310 occurs, current begins to flow through the organic EL element 310. Accordingly, a reverse bias current Ir1 flows in a concentrated manner through the first portion 16c of the electron transport layer 16, as illustrated in FIG. 8A. When the reverse bias current Ir1 flows in a concentrated manner through the first portion 16c, the first portion 16c heats up and the temperature thereof rises accordingly. As a result, in the first portion 16c, the organic material 16a transitions into the gas phase, which results in the gap 4 being formed in the first portion 16c, as illustrated in FIG. 8B. Further, in the first portion 16c, the metal 16b is released from the organic material 16a due to the transition of the organic material 16a to the gas phase and is deposited on a side wall portion of the gap 4. Thus, a channel portion 305, which functions as a path of current flow between the cathode 17 and the organic light-emission layer 15, is formed. The channel portion 305 is made of the metal 16b released from the organic material 16a, and thus has high electrical conductivity. As such, due to the forming of the channel portion 305, the electrical resistance of the first portion 16c is reduced, and the organic EL element 310 is put in a permanent short-circuit state. In this way, when the organic EL element 310 has the defective portion 3, the organic EL element 310 is made detectable as a dark spot.

Subsequent to the forming of the gap 4 and the channel portion 305 as described above, a forward bias voltage is applied between the anode 12 and the cathode 17 of the organic EL element 310. When the organic EL element 310 has the defective portion 303, upon application of the forward bias voltage, a forward bias current If flows in a concentrated manner through the first portion 16c via the channel portion 305, while rarely flowing through other portions. Due to this, the organic EL element 310, when having the defective portion 303, does not light, and is detected as a dark spot in the dark spot detection process.

Following this, repair processing is performed with respect to the organic EL element 310 when the organic EL element 310 is detected as a dark spot in the dark spot detection process, as in embodiments 1 and 2.

Here, note that in embodiment 3, the application of the reverse bias voltage is continued until the gap 4 is formed, as in embodiments 1 and 2. Specifically, a voltage between 10 V and 30 V is applied for a period of 10 minutes, for example.

Further, in embodiment 3, the transition of the organic material 16a to the gas phase need not occur across the entire first portion 16c, as in embodiments 1 and 2.

[3.3 Summary of Embodiment 3]

As description has been provided up to this point, the organic EL display panel 300 pertaining to embodiment 3 includes the electron transport layer 16 as the functional layer. The electron transport layer 16 is disposed above the defective portion 303 and is made of the organic material 16a doped with the metal 16b. Thus, the functional layer in embodiment 3 is similar to the functional layers in embodiments 1 and 2. Due to this, when the organic EL element 310 has the defective portion 303, the electrical resistance of the first portion 16c is reduced when the reverse bias voltage is applied to the organic EL element 310. Accordingly, the organic EL element 310, when including the defective portion 303 and thus is a potential dark spot, is made detectable as a dark spot. Further, in the subsequent dark spot detection process, the organic EL element 310, when including the defective portion 303, is detected as a dark spot with a high degree of certainty. This is similar to the cases described in embodiments 1 and 2.

As such, according to the defect detection method pertaining to embodiment 3, the organic EL element 310, when including the defective portion 303 and thus is a potential dark spot, is forcedly transformed into a dark spot. As such, the organic EL element 310, when including the defective portion 303, is detected as a dark spot in the dark spot detection process with a high degree of certainty, and thus can be repaired prior to the shipment of the organic EL display panel 300 as a product. As such, the occurrence of dark spots in the organic EL display panel 300 while being used by a user, which results in reduction of quality of the organic EL display panel 300, is prevented. This is similar to the cases described in embodiments 1 and 2.

[Modifications]

In embodiments 1 through 3, description is provided on the structure of the present invention. However, the present invention is not to be construed as being limited by the description provided in embodiments 1 through 3. For example, the modifications described in the following can be made without departing from the spirit and the scope of the present invention.

(1) In embodiment 3, the electron transport layer 16 is the functional layer made of an organic material doped with a metal. However, the present invention is not limited to this. For example, in embodiment 3, instead of the electron transport layer 16, the hole injection layer 13 may be made of an organic material doped with a metal, and thus the hole injection layer 13 may be the functional layer. Even when applying the above-described modification of forming the hole injection layer 13 by using an organic material doped with a metal to embodiment 3, the reverse bias current Ir1 flows in a concentrated manner through a portion of the hole injection layer 13 located above the defective portion 303, and a gap and a channel portion are formed in the above-described portion of the hole injection layer 13, as in the first portion 13c in embodiment 2. As such, the electrical resistance of the portion of the hole injection layer 13 located above the defective portion 303 is reduced. Due to this, an organic EL element pertaining to this modification, when including the defective portion 303 and thus is a potential dark spot, is forcedly transformed into a dark spot with a high degree of certainty, and thus can be repaired with certainty.

(2) In each of the embodiments, description is provided of a structure including only one layer that is the functional layer made of an organic material doped with a metal. However, the present invention is not limited to this. For example, both the electron transport layer 16 and the hole injection layer 13 maybe made of an organic material doped with a metal and thus correspond to the functional layer.

For example, when applying such a modification to embodiment 3, where the defective portion is a protrusion portion of an electrode surface, two channel portions are formed above the defective portion with the light-emission layer 15 in between, and thus, the electrical resistance of the organic EL element 310 above the defective portion 303 can be reduced to a further extent. By making such a modification, the organic EL element 310, when including the defective portion 303 and thus is a potential dark spot, is forcedly transformed into a dark spot with an even higher degree of certainty, and thus can be repaired with certainty.

(3) In embodiments 1 and 2, description is provided on cases where the defective portion is a foreign particle, in particular. On the other hand, in embodiment 3, description is provided on a case where the defective portion is a protrusion portion of a surface of a pixel electrode (corresponding to the anode 12 in embodiment 3), in particular. However, the present invention is not limited to the defective portion being the particular defective portions described in the embodiments. For example, the defective portion may be a recess. More specifically, the defective portion may be a recess formed in a surface of a pixel electrode. Specifically, in the forming of a pixel electrode in an organic EL element, there are cases where the pixel electrode is formed to have a recess in a surface thereof, due to failures such as uneven application of resist material, a pinhole formed in the resist, etc., in the etching of the pixel electrode.

When a recess as described above is formed and a given layer is formed above the recess, the layer may be discontinuous above the recess or a portion of the layer located above the recess may be extremely thin compared to a portion of the layer that is not located above the recess. Such problems result in the generation of a leakage current.

Here, note that even when the defective portion is a recess as described above and the above-described problems occur, similar effects as those described in the embodiments and the modifications can be achieved by forming at least one of the electron injection layer 16 and the hole injection layer 13 by using an organic material doped with a metal. That is, by forming at least one of the electron injection layer 16 and the hole injection layer 13 by using an organic material doped with a metal, an organic EL element having the defective portion (a recess in this case) and thus being a potential dark spot is forcedly transformed into a dark spot, and thus can be detected as a dark spot with a high degree of certainty. As such, the organic EL element having the defective portion and thus being a potential dark spot can be repaired prior to the shipment of the organic EL display panel including the organic EL element as a product. As such, the occurrence of dark spots in the organic EL display panel while being used by a user, which results in reduction of quality of the organic EL display panel, is prevented.

(4) The organic EL display panel pertaining to one aspect of the present invention may, in addition to the layers described in the embodiments, further include layers such as a hole transport layer, an electron injection layer, a passivation film, and a transparent conductive layer.

(5) In the organic EL display panel pertaining to each of the embodiments, one of the hole injection layer 13 and the electron transport layer 16 which does not function as the functional layer may be omitted from the structure.

[Industrial Applicability]

The defect detection method, the repair method of an organic EL element, and the organic EL display panel pertaining to the present invention is applicable, for example, to an organic EL display panel used in various display devices, television devices, displays for portable electronic devices, etc., for household use, for use in public facilities, or for business use.

REFERENCE SIGNS LIST 1 organic EL display device
3, 303 defective portion
4 gap
5, 205, 305 channel portion
10, 210, 310 organic EL element
11 substrate 12 anode
13 hole injection layer
13a, 16a organic material
13b, 16b metal
13c, 16c first portion
13d, 16d second portion
14 bank
14a opening
15 organic light-emission layer
16 electron transport layer
17 cathode
18 sealing layer
100, 200, 300 organic EL display panel

The invention claimed is:

1. A defect detection method performed with respect to an organic electroluminescence (EL) element including a first electrode, a second electrode, a functional layer, and a light-emission layer, the functional layer and the light-emission layer disposed between the first electrode and the second electrode, the method comprising:
applying a first voltage between the first electrode and the second electrode, the first voltage, when the organic EL element includes a defective portion, between the first electrode and the second electrode, that is a potential cause of non-light emission of the light-emission layer, reducing an electrical resistance of a first portion of the functional layer, the first portion being a portion of the functional layer corresponding to the defective portion; and
applying, after the application of the first voltage, a second voltage between the first electrode and the second electrode and thus detecting whether or not the organic EL element is a dark spot, the second voltage, when the organic EL element does not include the defective portion, causing the light-emission layer to emit light, the dark spot being an organic EL element whose light-emission layer does not emit light,
wherein, in the applying of the first voltage, a first current is applied until the electrical resistance of the first portion is reduced to lower than an electrical resistance of a second portion of the functional layer when the organic EL element includes the defective portion, the second portion being a portion of the functional layer not corresponding to the defective portion.

2. The defect detection method of claim 1, wherein
the functional layer is made of an organic material doped with a metal, and
in the applying of the first voltage, when the organic EL element includes the defective portion, the first voltage reduces the electrical resistance of the first portion by causing the first portion to conduct current and thus heat up, whereby in the first portion, a gap is formed due to transition of the organic material to a gas phase and the metal, which is released from the organic material due to the transition of the organic material to the gas phase, is deposited onto a side wall portion of the functional layer surrounding the gap.

3. The defect detection method of claim 1, wherein
the first electrode is an anode and the second electrode is a cathode, and
in the applying of the first voltage, a higher voltage is applied to the second electrode than to the first electrode.

4. The defect detection method of claim 1, wherein
the defective portion is located below the functional layer and comprises at least one of a protrusion, a recess, and a foreign particle having higher electrical conductivity than the light-emission layer, and
the first portion is located above the defective portion and has an area having smaller film thickness than the second portion.

5. The defect detection method of claim 4, wherein
the functional layer is made of a material whose electrical resistance decreases in proportion with an increase in a cumulative amount of current flowing through the functional layer.

6. The defect detection method of claim 4, wherein
in the applying of the first voltage, when the organic EL element includes the defective portion, the electrical resistance of the first portion is reduced to lower than the electrical resistance of the second portion by the first voltage causing the first portion to conduct a greater current than the second portion and thereby altering the first portion.

7. The defect detection method of claim 4, wherein
in the applying of the first voltage, when the organic EL element includes the defective portion, the first voltage causes the first portion to conduct a greater current than the second portion and thereby induces a stronger electric field in the first portion than in the second portion, whereby in at least a part of the first portion, a gap is formed due to destruction or alteration of shape of the first portion.

8. A repair method performed with respect to an organic EL element, comprising:
processing an organic EL element having been detected, according to the defect detection method of claim 1, as the dark spot such that electrical resistance is increased of at least one of a portion of the first electrode corresponding to the first portion and a portion of the second electrode corresponding to the first portion.

9. An organic electroluminescence (EL) display panel comprising a substrate and a plurality of organic EL elements formed above the substrate, wherein
each of the organic EL elements includes:
a light-emission layer;
a functional layer disposed above the light-emission layer and made of an organic material doped with a metal; and
a pair of electrodes between which the light-emission layer and the functional layer are disposed,
at least one of the organic EL elements has, below the functional layer, at least one of a protrusion, a recess, and a foreign particle having higher electrical conductivity than the light-emission layer, and
in the at least one of the organic EL elements, the functional layer has a first portion located above the at least one of the protrusion, the recess, and the foreign particle, and a gap in at least a part of the first portion, the gap having the metal, with which the organic material is doped, deposited onto a perimeter thereof.

10. A defect detection method performed with respect to an organic electroluminescence (EL) element including a first electrode, a second electrode, a functional layer, and a light-emission layer, the functional layer and the light-emission layer disposed between the first electrode and the second electrode, the method comprising:
applying a first voltage between the first electrode and the second electrode, the first voltage, when the organic EL element includes a defective portion, between the first electrode and the second electrode, that is a potential cause of non-light emission of the light-emission layer, reducing an electrical resistance of a first portion of the functional layer, the first portion being a portion of the functional layer corresponding to the defective portion; and applying, after the application of the first voltage, a second voltage between the first electrode and the second electrode and thus detecting whether or not the organic EL element is a dark spot, the second voltage, when the organic EL element does not include the defective portion, causing the light-emission layer to emit light, the dark spot being an organic EL element whose light-emission layer does not emit light, wherein the functional layer is made of an organic material doped with a metal, and in the applying of the first voltage, when the organic EL element includes the defective portion, the first voltage reduces the electrical resistance of the first portion by causing the first portion to conduct current and thus heat up, whereby in the first portion, a gap is formed due to transition of the organic material to a gas phase and the metal, which is released from the organic material due to the transition of the organic material to the gas phase, is deposited onto a side wall portion of the functional layer surrounding the gap.

11. The defect detection method of claim 10, wherein the first electrode is an anode and the second electrode is a cathode, and in the applying of the first voltage, a higher voltage is applied to the second electrode than to the first electrode.

12. A repair method performed with respect to an organic EL element, comprising:

processing an organic EL element having been detected, according to the defect detection method of claim 10, as the dark spot such that electrical resistance is increased of at least one of a portion of the first electrode corresponding to the first portion and a portion of the second electrode corresponding to the first portion.

\* \* \* \* \*